(12) United States Patent
Park et al.

(10) Patent No.: US 12,354,879 B2
(45) Date of Patent: Jul. 8, 2025

(54) METHOD OF FABRICATING SEMICONDUCTOR DEVICE AND METHOD OF SEPARATING SUBSTRATE

(71) Applicant: Samsung Electronics Co., Ltd., Suwon-si (KR)

(72) Inventors: Cheonil Park, Seongnam-si (KR); Wonkeun Kim, Hwaseong-si (KR); Myoungchul Eum, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 778 days.

(21) Appl. No.: 17/590,717

(22) Filed: Feb. 1, 2022

(65) Prior Publication Data
US 2023/0040281 A1   Feb. 9, 2023

(30) Foreign Application Priority Data

Jul. 5, 2021   (KR) .................. 10-2021-0087670

(51) Int. Cl.
| | |
|---|---|
| H01L 21/306 | (2006.01) |
| B32B 7/12 | (2006.01) |
| B32B 38/16 | (2006.01) |
| B32B 43/00 | (2006.01) |
| C09J 7/40 | (2018.01) |
| H01L 21/683 | (2006.01) |

(52) U.S. Cl.
CPC ......... *H01L 21/30625* (2013.01); *B32B 7/12* (2013.01); *B32B 38/162* (2013.01); *B32B 43/006* (2013.01); *C09J 7/401* (2018.01); *H01L 21/6836* (2013.01); *B32B 2310/0831* (2013.01); *B32B 2457/00* (2013.01); *C09J 2203/326* (2013.01); *C09J 2483/005* (2013.01)

(58) Field of Classification Search
None
See application file for complete search history.

(56) References Cited

U.S. PATENT DOCUMENTS

| | | |
|---|---|---|
| 7,163,986 B2 | 1/2007 | Sugo |
| 9,023,716 B2 | 5/2015 | Lee et al. |
| 9,029,269 B2 | 5/2015 | Bourbina et al. |

(Continued)

OTHER PUBLICATIONS

Gupta et al, "Polydimethylsiloxane as polymeric protective coating for fabrication of ultra-thin chips," Microelectronic Engineering 221 (2020) 111157.

(Continued)

*Primary Examiner* — Shamim Ahmed
(74) *Attorney, Agent, or Firm* — FINNEGAN, HENDERSON, FARABOW, GARRETT & DUNNER LLP

(57) ABSTRACT

Disclosed are methods of fabricating semiconductor devices and methods of separating substrates. The semiconductor device fabricating method comprises providing a release layer between a carrier substrate and a first surface of a device substrate to attach the device substrate to the carrier substrate, irradiating the carrier substrate with an ultraviolet ray to separate the carrier substrate from the release layer and to expose one surface of the release layer, and performing a cleaning process on the one surface of the release layer to expose the first surface of the device substrate. The release layer includes an aromatic polymerization unit and a siloxane polymerization unit.

20 Claims, 6 Drawing Sheets

(56) References Cited

U.S. PATENT DOCUMENTS

| | | | |
|---|---|---|---|
| 9,496,164 B2 | 11/2016 | Bai et al. | |
| 9,827,740 B2 | 11/2017 | Liu et al. | |
| 10,703,945 B2 | 7/2020 | Lin et al. | |
| 2015/0072454 A1 | 3/2015 | Kim et al. | |
| 2019/0127608 A1* | 5/2019 | Kim | H01L 21/6835 |
| 2021/0028217 A1* | 1/2021 | Cho | H01L 21/6836 |

OTHER PUBLICATIONS

Hsu et al., Polym. Chem. 2018, DOI: 10.1039/C8PY01283K "Intrinsically stretchable, solution-processable functional poly(siloxaneimide)s for stretchable resistive memory application".

Wohl et al, "Laser Ablative Patterning of Copoly(imide siloxane)s Generating Superhydrophobic Surfaces," Langmuir 2010, 26 (13), 11469-11478.

* cited by examiner

METHOD OF FABRICATING SEMICONDUCTOR DEVICE AND METHOD OF SEPARATING SUBSTRATE

CROSS-REFERENCE TO RELATED APPLICATION

This U.S. nonprovisional application claims priority under 35 U.S.C § 119 to Korean Patent Application No. 10-2021-0087670 filed on Jul. 5, 2021 in the Korean Intellectual Property Office, the disclosure of which is hereby incorporated by reference in its entirety.

BACKGROUND

The present inventive concepts relate to a method of fabricating a semiconductor device, and more particularly, to a method of fabricating a semiconductor device, which method uses a carrier substrate.

The development of electronic industry may provide low price electronic products having characteristics such as light weight, compact size, high speed, and high performance. A wafer-level substrate may be used in fabricating a semiconductor device. A wafer-level semiconductor substrate may be attached to a carrier substrate, and then the semiconductor substrate may be processed.

SUMMARY

Some embodiments of the present inventive concepts provide a simplified method of separating a device substrate and a method of fabricating a semiconductor device.

According to some embodiments of the present inventive concepts, a method of fabricating a semiconductor device may comprise: providing a release layer between a carrier substrate and a first surface of a device substrate to attach the device substrate to the carrier substrate; irradiating the carrier substrate with an ultraviolet ray to separate the carrier substrate from the release layer and to expose one surface of the release layer; and performing a cleaning process on the one surface of the release layer to expose the first surface of the device substrate. The release layer may include an aromatic polymerization unit and a siloxane polymerization unit.

According to some embodiments of the present inventive concepts, a method of separating a substrate may comprise: providing a wafer support structure that includes a device substrate, a carrier substrate, and a release layer between the device substrate and the carrier substrate; irradiating the carrier substrate with an ultraviolet ray to separate the carrier substrate from the release layer; and using a cleansing agent to remove the release layer and to expose the device substrate. The release layer may include: an aromatic polymerization unit that is decomposed by the ultraviolet ray; and a siloxane polymerization unit that is decomposed by the cleansing agent.

According to some embodiments of the present inventive concepts, a method of fabricating a semiconductor device may comprise: providing a release layer between a carrier substrate and a first surface of a device substrate to attach the device substrate to the carrier substrate; performing a processing process on a second surface of the device substrate to form a processed device substrate; irradiating the carrier substrate with an ultraviolet ray to separate the carrier substrate from the release layer and the processed device substrate and to expose one surface of the release layer; and allowing the one surface of the release layer to undergo a cleaning process to expose the first surface of the device substrate. The release layer may include: a first polymerization unit that is decomposed by irradiation of the ultraviolet ray; and a second polymerization unit that is decomposed by the cleaning process. The second polymerization unit may be different from the first polymerization unit.

DETAILED DESCRIPTION OF EMBODIMENTS

Figure 1A:
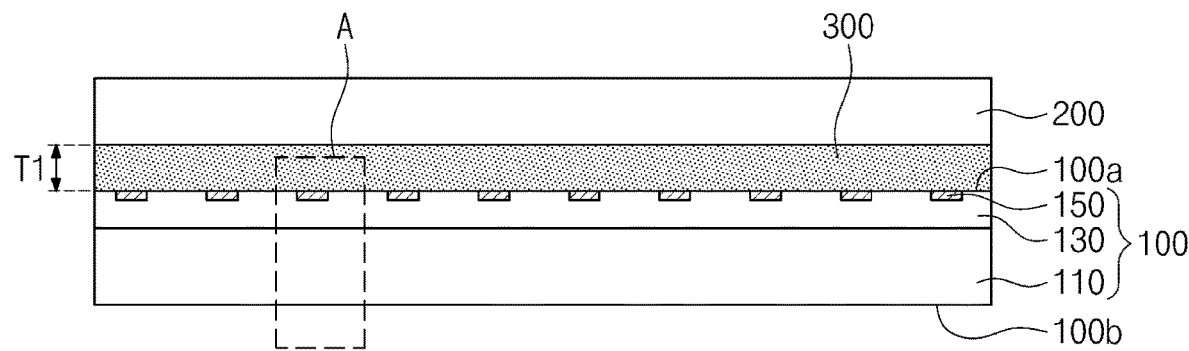
FIGS. 1A, 1D, 1E, 1F, and 1G illustrate cross-sectional views showing a method of fabricating a semiconductor device according to some embodiments.

In this description, like reference numerals may indicate like components. In this description, symbol

indicates a connection location. In this description, symbol

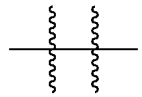

indicates a location where a bond is broken. An aromatic cyclic compound may be monocyclic or polycyclic.

The following will discuss a release layer and a semiconductor device fabricating method using the release layer.

FIGS. 1A and 1D to 1G illustrate cross-sectional views showing a method of fabricating a semiconductor device according to some embodiments of the present inventive concepts. FIG. 1B illustrates an enlarged view showing section A of FIG. 1A.

Figure 1B:
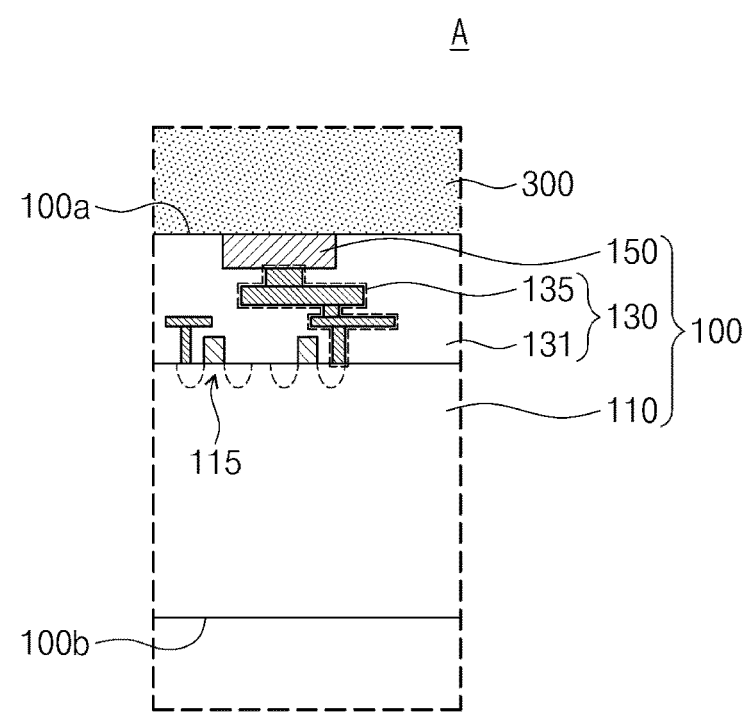
FIG. 1B illustrates an enlarged view showing section A of FIG. 1A.

Referring to FIGS. 1A and 1B, a wafer support structure may be provided which includes a device substrate 100, a release layer 300, and a carrier substrate 200. The wafer support structure may be a wafer support system.

The device substrate 100 may be a wafer-level substrate. The device substrate 100 may include a semiconductor substrate 110, integrated circuits 115, a circuit layer 130, and chip pads 150. The device substrate 100 may have a first surface 100a and a second surface 100b that are opposite to each other. The first surface 100a may be a top surface of the device substrate 100, and the second surface 100b may be a bottom surface of the device substrate 100. The first surface 100a of the device substrate 100 may correspond to a top surface of the circuit layer 130, and the second surface 100b of the device substrate 100 may correspond to a bottom surface of the semiconductor substrate 110.

The semiconductor substrate 110 may be a semiconductor wafer. For example, the semiconductor substrate 110 may include a semiconductor material, such as silicon, germanium, or silicon-germanium. The semiconductor substrate may have a bottom surface and a top surface that are opposite to each other. The bottom surface of the semiconductor substrate 110 may be a rear surface of the semiconductor substrate 110. The top surface of the semiconductor substrate 110 may be a front surface of the semiconductor substrate 110. As illustrated in FIG. 1B, the integrated circuits 115 may be provided on the top surface of the semiconductor substrate 110. The integrated circuits 115 may include transistors. The circuit layer 130 may be provided on the top surface of the semiconductor substrate 110. The circuit layer 130 may include a dielectric layer 131 and wire structures 135. The dielectric layer 131 may be disposed on the top surface of the semiconductor substrate 110 and may cover the integrated circuits 115. The dielectric layer 131 may include a plurality of layers. The dielectric layer 131 may include one or more of silicon oxide, silicon nitride, and silicon oxynitride. The wire structures 135 may be disposed in the dielectric layer 131. The wire structures 135 may be electrically connected to the integrated circuits 115. The wire structures 135 may include a conductive material, such as one or more of copper and tungsten. In this description, the phrase "electrically connected/coupled" may include "directly connected/coupled" or "indirectly connected/coupled through other conductive component(s)." The chip pads 150 may be exposed on the first surface 100a of the device substrate 100. The chip pads 150 may be electrically connected to the wire structures 135. The chip pads 150 may include a conductive material, such as one or more of aluminum, gold, and copper. In figures other than FIGS. 1B and 1C, for brevity of drawings, there is an omission of the dielectric layer 131, the wire structures 135, and the integrated circuits 115. The present inventive concepts, however, are not limited thereto.

Although not shown, the device substrate 100 may further include through vias, and the through vias may be provided in the semiconductor substrate 110. The through vias may further penetrate a portion of the dielectric layer 131. The through vias may be electrically connected through the wire structures 135 to either the chip pads 150 or the integrated circuits 115. The through vias may include a conductive material, such as metal.

As shown in FIG. 1A, the carrier substrate 200 may be disposed on the first surface 100a of the device substrate 100. In this case, the carrier substrate 200 may be spaced apart from the first surface 100a of the device substrate 100. The carrier substrate 200 may include, for example, glass, quartz or sapphire. The material of the carrier substrate 200 may be variously changed. For example, the carrier substrate 200 may include one or more of a polymer, an inorganic material, and a carbon-containing material. The carrier substrate 200 may be transparent to light, e.g. highly transmissive to the light used in the process for separating the carrier substrate 200, e.g. UV light.

The formation of the wafer support structure may include providing the release layer 300 between the carrier substrate 200 and the first surface 100a of the device substrate 100. The device substrate 100 may be attached through the release layer 300 to the carrier substrate 200.

For example, a coating process may form the release layer 300 on a bottom surface of the carrier substrate 200. Afterwards, the carrier substrate 200 and the device substrate 100 may be disposed spaced apart from each other to allow the release layer 300 to face the first surface 100a of the device substrate 100. Either the carrier substrate 200 or the device substrate 100 may move such that the release layer 300 may be attached to the semiconductor substrate 110. Alternatively, a coating process may form the release layer 300 on the first surface 100a of the semiconductor substrate 110. After that, the carrier substrate 200 may be attached to a top surface of the release layer 300.

The release layer 300 may have a first thickness T1. The first thickness T1 may be a maximum interval between the first surface 100a of the device substrate 100 and the bottom surface of the carrier substrate 200. When the first thickness T1 is less than about 10 nm, it may be difficult to coat the release layer 300. When the first thickness T1 is greater than about 500 μm, it may be possible to reduce fabrication efficiency of semiconductor devices. According to some embodiments, the first thickness T1 may range from about 10 nm to about 500 μm. Therefore, it may be possible to easily perform a coating process of the release layer 300 and to satisfactorily form the release layer 300. In addition, it may be possible to increase fabrication efficiency of semiconductor devices.

The release layer 300 may include a copolymer. For example, the release layer 300 may include a first polymerization unit and a second polymerization unit. The first polymerization unit may be an aromatic polymerization unit. The aromatic polymerization unit may include an aromatic cyclic compound. The aromatic polymerization unit may originate from a C5 to C100 aromatic monomer. The aromatic polymerization unit may be a monocyclic structure or a polycyclic structure. A plurality of different aromatic monomers can also be provided to form an aromatic oligomer for combining with the second polymerization unit. The first polymerization unit may absorb light. The first polymerization unit may react with light, and the light may decompose the first polymerization unit. In this case, the light may include an ultraviolet ray and may have a wavelength equal to or less than about 400 nm.

The second polymerization unit may be different from the first polymerization unit. For example, the second polymerization unit may have a chemical structure different from that of the first polymerization unit and may function differently from the first polymerization unit. The second polymerization unit may be a siloxane polymerization unit. The second polymerization unit may originate from a siloxane monomer or a plurality of different monomers that are combined to form a siloxane oligomer for polymerizing with the aromatic monomer or oligomer. The siloxane polymerization unit may have reactivity to a cleansing agent. For example, the cleansing agent may dissolve the siloxane polymerization unit.

The release layer 300 may be represented by Chemical Formula 1 below. A material represented by Chemical Formula 1 may have a number average molecular weight of about 300 g/mol to about 50,000 g/mol.

[Chemical Formula 1]

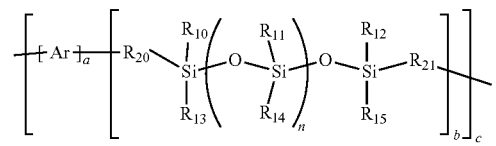

In Chemical Formula 1, Ar may include C5 to C100 substituted or unsubstituted aromatic cyclic compound, $R_{10}$, $R_{11}$, $R_{12}$, $R_{13}$, $R_{14}$, and $R_{15}$ may independently represent hydrogen, an aryl group or an alkyl group having 1 to 5 carbon atoms, e.g. 1 to 3 carbon atoms, $R_{20}$ and $R_{21}$ may independently represent hydrogen or an alkyl group having 1 to 5 carbon atoms, a may be an integer between 1 and 100, b may be an integer between 1 and 100, n may be an integer between 1 and 1000, and c may be an integer between 10 and 100000.

The material represented by Chemical Formula 1 may include a material represented by Chemical Formula 1A below.

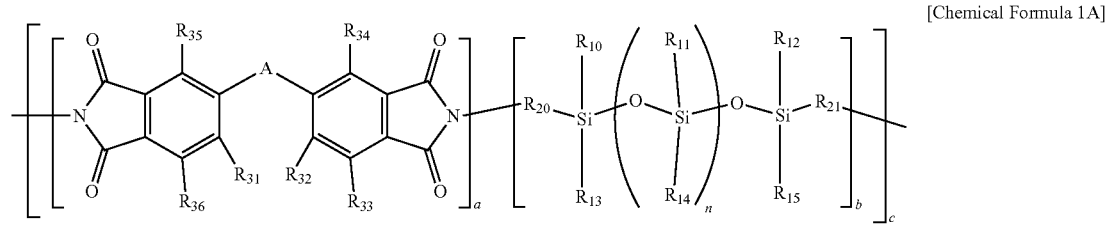

[Chemical Formula 1A]

In Chemical Formula 1A, $R_{10}$, $R_{11}$, $R_{12}$, $R_{13}$, $R_{14}$, and $R_{15}$ may independently represent hydrogen, an aryl group, or an alkyl group having 1 to 5 carbon atoms, e.g. 1 to 3 carbon atoms, $R_{20}$ and $R_{21}$ may independently represent hydrogen or an alkyl group having 1 to 5 carbon atoms, $R_{31}$, $R_{32}$, $R_{33}$, $R_{34}$, $R_{35}$, and $R_{36}$ may independently represent hydrogen or an alkyl having 1 to 3 carbon atoms, A may represent a single bond, oxygen (O), sulfur (S), a C5 to C10 alkyl group, or a C5 to C50 aromatic cyclic compound, a may be an integer between 1 and 100, b may be an integer between 1 and 100, n may be an integer between 1 and 1000, and c may be an integer between 10 and 100000. In Chemical Formula IA, carbon bonded to $R_{31}$ may be connected to $R_{32}$, thereby constituting a cyclic structure.

In Chemical Formula 1, Ar may be the first polymerization unit. In some examples of Chemical Formula 1, the ratio of the wt % of the first polymerization unit to the wt % of the second polymerization unit is from about 1:3 to 50:1, e.g. from 1:1 to 40:1, such as from 2:1 to 20:1.

In Chemical Formula 1, Ar may be a material represented by Chemical Formula 2 below.

[Chemical Formula 2]

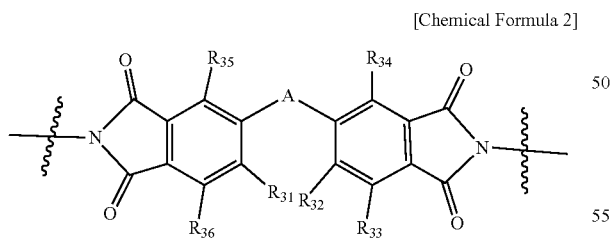

In Chemical Formula 2, $R_{31}$, $R_{32}$, $R_{33}$, $R_{34}$, $R_{35}$, and $R_{36}$ may independently represent hydrogen or an alkyl group having 1 to 3 carbon atoms, A may represent a single bond, oxygen (O), sulfur (S), a C5 to C10 alkyl group, or a C5 to C50 aromatic cyclic compound. Carbon bonded to Rn may be connected to $R_{32}$, thereby constituting a cyclic structure. Any non-aromatic portion of Chemical Formula 2 (e.g. alkyl groups) can be if desired less than half of the wt % of Chemical Formula 2, such that the aromatic portion is at a greater wt % than any non-aromatic portion.

The material given by Chemical Formula 2 may be represented by one of Chemical Formulae 2A, 2B, and 2C.

[Chemical Formula 2A]

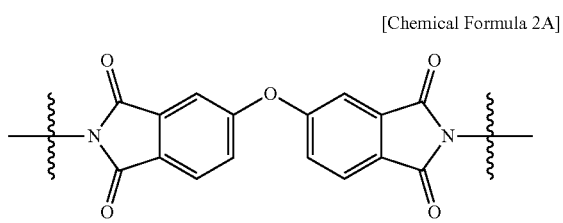

[Chemical Formula 2B]

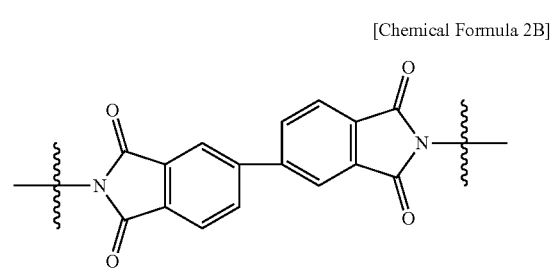

[Chemical Formula 2C]

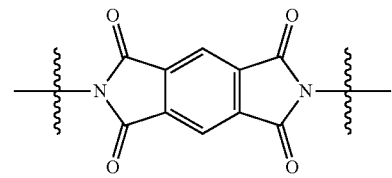

In Chemical Formula 1, Ar may be represented by one of Chemical Formulae 3, 4, 5-1, 5-2, and 5-3.

[Chemical Formula 3]

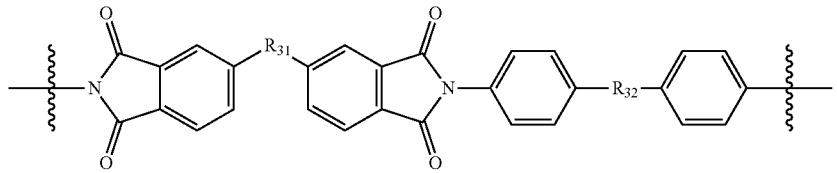

In Chemical Formula 3, $R_{31}$ and $R_{32}$ may independently be a single bond, oxygen (O), sulfur (S), a C1 to C10 alkyl group, or a C5 to C50 aromatic cyclic compound.

[Chemical Formula 4]

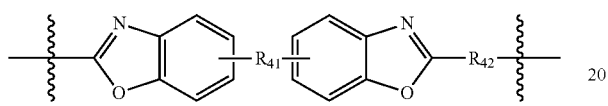

In Chemical 4, $R_{41}$ and $R_{42}$ may independently be a single bond, oxygen (O), sulfur (S), a C1 to C10 alkyl group, or a C5 to C50 aromatic cyclic compound.

[Chemical Formula 5-1]

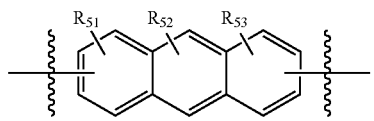

In Chemical Formula 5-1, $R_{51}$ and $R_{52}$ may independently be hydrogen or an alkyl group having 1 to 3 carbon atoms.

[Chemical Formula 5-2]

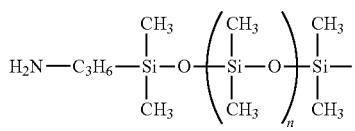

In Chemical Formula 5-2, $R_{51}$, $R_{52}$, and $R_{53}$ may independently be hydrogen or an alkyl group having 1 to 3 carbon atoms.

[Chemical Formula 5-3]

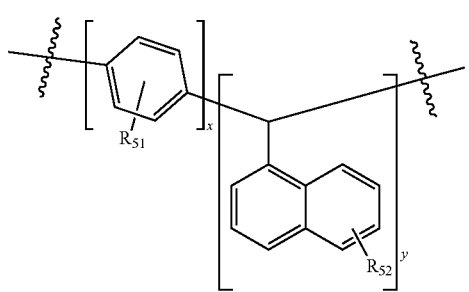

In Chemical Formula 5-3, $R_{51}$ and $R_{52}$ may independently be hydrogen or an alkyl group having 1 to 3 carbon atoms, x may be an integer between 1 and 100, and y may be an integer between 1 and 100.

The second polymerization unit may include a substituted or unsubstituted siloxane group. The substituted siloxane group may be a siloxane group substituted by one or more of an epoxy group, an alkoxy group such as an ethoxy group, a hydroxyl group, an alkenyl group such as a vinyl group, and an amine group. The release layer 300 may include a release agent. The release agent may include polysiloxane, such as polydimethylsiloxane.

For example, the release layer 300 may be formed as shown in Equation 1.

[Equation 1]

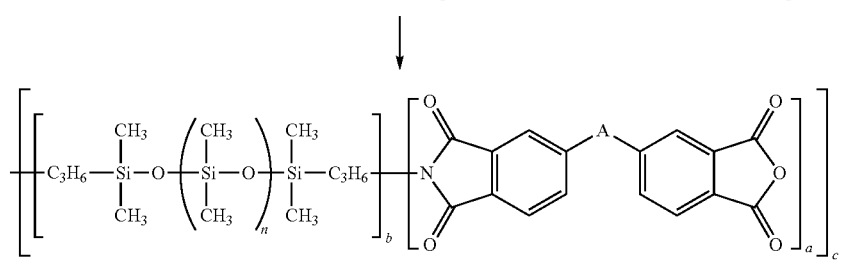

In Equation 1, A, a, b, and n may the same as those defined in Chemical Formula 1.

Figure 1C:
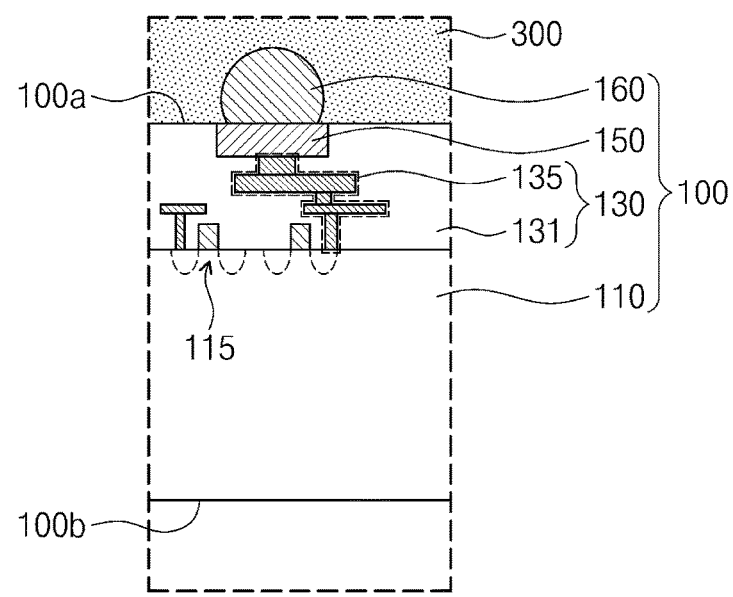
FIG. 1C illustrates a cross-sectional view showing a device substrate according to some embodiments.

FIG. 1C illustrates an enlarged cross-sectional view of section A depicted in FIG. 1A, showing a device substrate according to some embodiments. The description of FIG. 1C also refers to FIG. 1A.

Referring to FIG. 1C, the device substrate 100 may include a semiconductor substrate 110, integrated circuits 115, a circuit layer 130, a chip pad 150, and a solder ball 160. The semiconductor substrate 110, the integrated circuits 115, the circuit layer 130, and the chip pad 150 may be substantially the same as those discussed in FIGS. 1A and 1B. The solder ball 160 may be provided on a top surface of the chip pad 150. The solder ball 160 may include one or more of tin (Sn), silver (Ag), zinc (Zn), lead (Pb), and any alloy thereof. In this case, the release layer 300 may be provided on the first surface 100a of the device substrate 100, thereby covering the solder ball 160. The first thickness T1 discussed in FIG. 1A may correspond to an interval between a top surface of the circuit layer 130 and a bottom surface of the carrier substrate 200. In figures other than FIG. 1C, the illustration of the solder ball 160 is omitted in the interest of brevity. The present inventive concepts, however, generally include but may exclude the solder ball 160.

Figure 1D:
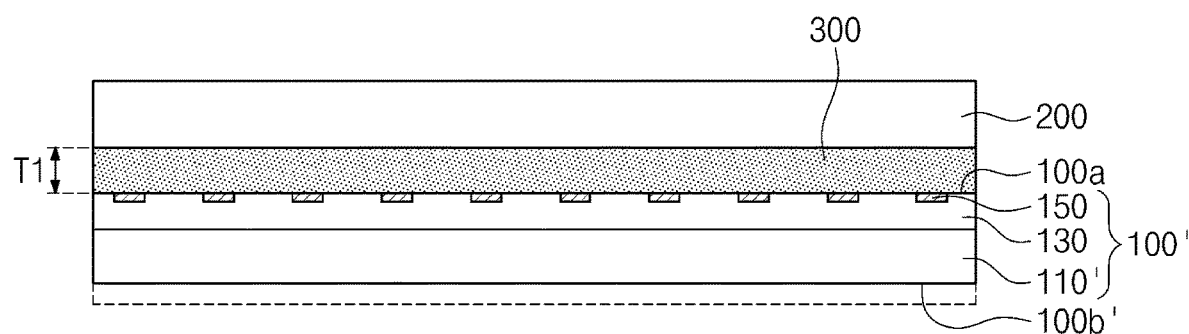

Referring to FIG. 1D, the second surface 100b of the device substrate 100 may undergo a processing process to form a processed device substrate 100'. The processing process may include a grinding process or a polishing process. The polishing process may include a chemical mechanical planarization process. As a result of the processing process, as denoted by a dotted line, a portion of the semiconductor substrate 110 may be removed to form a thinned semiconductor substrate 110'. The processed device substrate 100' may include the thinned semiconductor substrate 110', the integrated circuits (see 115 of FIG. 1B or 1C), the circuit layer 130, and the chip pads 150. The processed device substrate 100' may have a grinded surface on a second surface 100b' thereof. The second surface 100b' of the processed device substrate 100 may be a bottom surface of the thinned semiconductor substrate 110'.

Figure 1E:
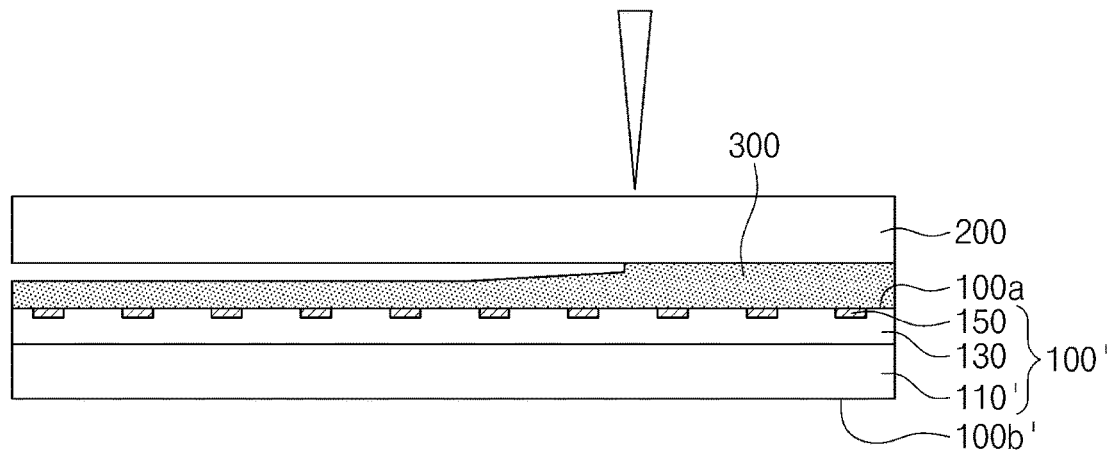

Referring to FIG. 1E, the carrier substrate 200 may be irradiated with light to cause the carrier substrate 200 to separate into the release layer 300 and the processed semiconductor substrate 110'. The light may be an ultraviolet ray. The light may have, for example, a wavelength equal to or less than about 400 nm. The irradiation of light may be accomplished by using a laser technique such as laser ablation. The laser may be an excimer laser using XeCl. Alternatively, the laser may be an excimer laser using KrF, XeF, or ArF. Alternatively a diode-pumped solid state laser, mercury vapor lamp, or other suitable UV source could be used. The power of the excimer laser can be any suitable power such as from 1 to 100 W, Also a blue light gas or solid state laser can be used depending on the material type and thickness selected.

The light may be irradiated onto the release layer 300 after penetrating the carrier substrate 200. The ultraviolet ray may decompose a portion of the release layer 300. For example, the first polymerization unit of the release layer 300 may absorb and react with the ultraviolet ray. The reaction may be a decomposition reaction. According to some embodiments, the decomposition reaction of the first polymerization unit may be performed as represented by Equation 2 below.

[Equation 2]

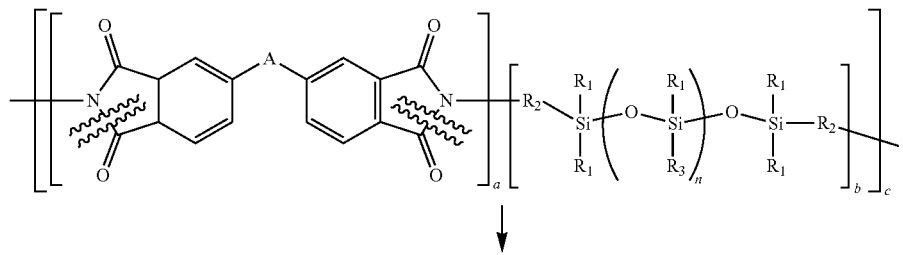

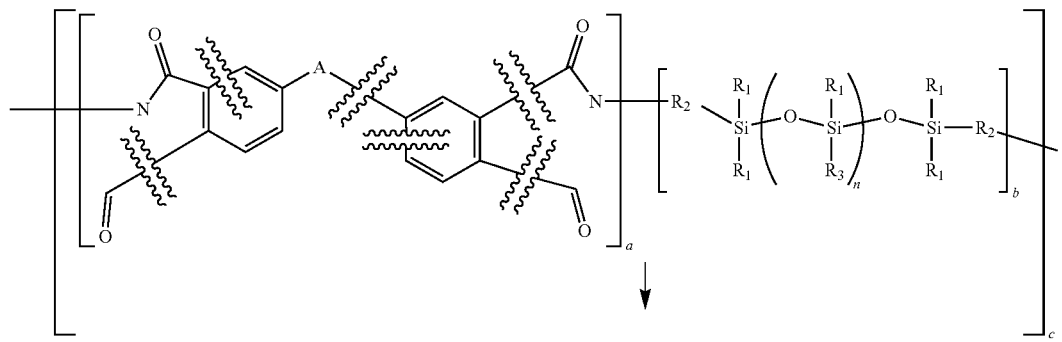

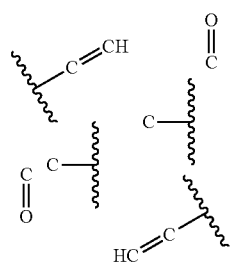

In Equation 2, $R_1$ may represent hydrogen or an alkyl group having 1 to 3 carbon atoms, $R_2$ may represent hydrogen or an alkyl group having 1 to 5 carbon atoms, A may represent a single bond, oxygen (O), sulfur (S), a C1 to C10 alkyl group, or a C5 to C50 aromatic cyclic compound, a may be an integer between 1 and 100, b may be an integer between 1 and 100, n may be an integer between 1 and 1000, and c may be an integer between 10 and 100000.

For example, the decomposition reaction of the first polymerization unit may include bond breakage of aromatic ring. When the first polymerization unit further includes an imide group or an amide group, the decomposition reaction may further include bond breakage in the imide group or bond break-age in the amide group. For example, a product of the decomposition reaction may include CO, $CO_2$, $H_2O$, $C_2H_2$, $CH_4$, CN, or HCN. The product of the decomposition reaction may be a volatile material or a gaseous material. As one example, the average molecular weight of the first polymerization unit after application of the UV light (namely the average molecular weight of the smaller compounds that result from the decomposition of the first polymerization unit) is less than 25% of the average molecular weight of the first polymerization unit prior to application of the UV light, e.g. less than 10%, such as less than 5%. The smaller compounds can be volatile/gaseous compounds that are vaporized and released from the release layer which in turn allows for the separation and removal of the carrier substrate. An upper portion of the release layer 300 may be removed by the decomposition reaction. When the irradiation of light is completed, the carrier substrate 200 may be separated from the release layer 300 and the processed device substrate 100'. A remaining portion of the release layer 300 may remain without being removed.

Figure 1F:
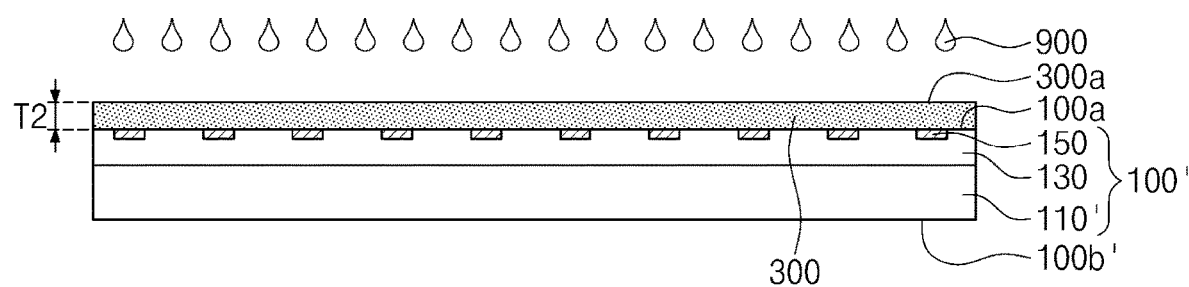

Referring sequentially to FIGS. 1E and 1F, the separation of the carrier substrate 200 may expose one surface 300a of the release layer 300 that remains. The one surface 300a may be a top surface of the release layer 300. The remaining release layer 300 may have a second thickness T2. The second thickness T2 may be the same as or less than the first thickness T1 of FIG. 1A.

Figure 1G:
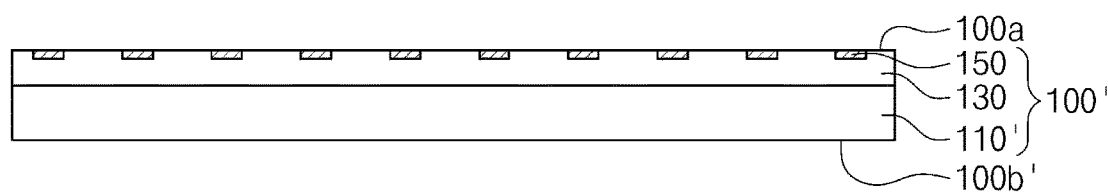

Referring sequentially to FIGS. 1F and 1G, a cleaning process may be performed on the exposed one surface 300a of the release layer 300. The cleaning process may be a chemical cleaning process in which a cleansing agent is used. The cleansing agent may include a quaternary ammonium cation and a halogen anion. For example, the cleansing agent may be represented by Chemical Formula A below.

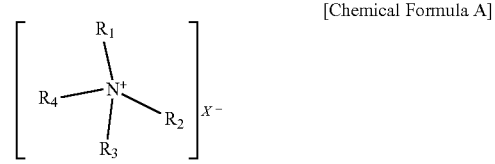

In Chemical Formula A, $R_1$, $R_2$, $R_3$, and $R_4$ may independently be hydrogen or an alkyl group having 1 to 10 carbon atoms, and X may represent one of fluorine, chlorine, bromine, and iodine.

For example, the cleansing agent may be tetra-n-butylammonium fluoride (TBAF). Other quaternary ammonium salts such as tetra-n-butylammonium bromide (TBAB) etc could be used.

The cleansing agent may react with the siloxane group of the second polymerization unit of the release layer 300. The reaction of the siloxane group may be a decomposition reaction. According to some embodiments, the decomposition reaction of the second polymerization unit of the release layer 300 may be performed as represented by Equation 3 below.

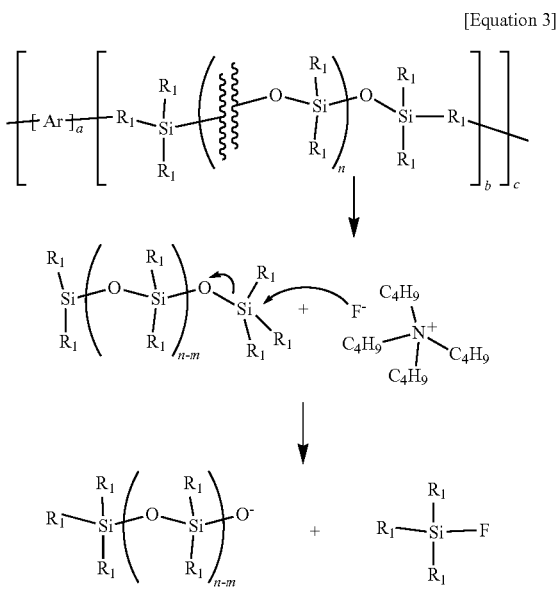

In Equation 3, Ar, a, b, and n may be the same as those discussed in Chemical Formula 1, $R_1$ may represent hydrogen or an alkyl group having 1 to 3 carbon atoms, and m may be a natural number between 1 and n.

According to Equation 3, a Si—O—Si bond of polysiloxane in the release agent may be decomposed to form a siloxane oligomer. The siloxane oligomer may have a molecular weight less than that of the polysiloxane. The siloxane oligomer may react with the cleansing agent, thereby being further decomposed. As one example, the average molecular weight of the siloxane oligomers after application of the cleansing agent is less than 25% of the average molecular weight of the polysiloxane prior to application of the cleansing agent, e.g. less than 10%, such as less than 5%. The smaller molecular weight siloxane oligomers are removed from the release layer by the cleansing agent.

When the release layer 300 includes no siloxane polymerization unit, it may be difficult for the cleansing agent to remove the release layer 300. For example, after the irradiation of the ultraviolet ray, at least two processes may be needed in the case of having difficulty in removing the remaining release layer 300 or for the purpose of removing the remaining release layer 300. The at least two processes may include a plasma descum process or a dry etching process. Alternatively, due to the dry etching process, an inorganic layer (not shown) may further be formed on the device substrate 100. The inorganic layer may be an unintended layer. The cleansing agent may not remove the inorganic layer. According to some embodiments, the second polymerization unit of the release layer 300 may include a siloxane group, and may be satisfactorily removed (e.g. at least 99.5% such as 99.9% or more of the second polymerization unit is removed) by the cleaning process in which the cleansing agent is used. In addition, the inorganic layer may be prevented from being formed.

As shown in FIG. 1G, the removal of the release layer 300 may expose the first surface 100a of the device substrate 100' (e.g. at least 99.5%, such as 99.9% or more of the substrate is exposed). Accordingly, the separation of the device substrate 100' may be completed, and thus a semiconductor device may be fabricated.

When the first thickness T1 discussed in FIG. 1A is greater than about 500 μm, it may be difficult to remove the release layer 300 in the steps of FIGS. 1F and 1G. According to some embodiments, as the first thickness T1 is equal to or less than about 500 μm, it may be possible to satisfactorily remove the release layer 300.

Although not shown, after the removal of the release layer 300, a dicing process may further be performed on the device substrate 100', such that the device substrate 100' may be separated into a plurality of semiconductor devices. In this case, the semiconductor devices may be semiconductor chips.

FIGS. 2A to 2E illustrate cross-sectional views showing a method of fabricating a semiconductor device according to some embodiments of the present inventive concepts. A duplicate description will be omitted below.

Figure 2A:
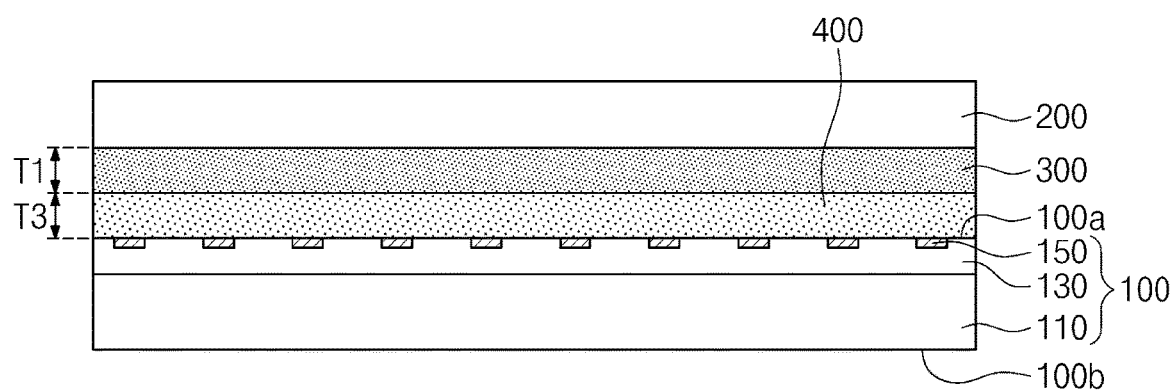
FIGS. 2A to 2E illustrate cross-sectional views showing a method of fabricating a semiconductor device according to some embodiments of the present inventive concepts.

Referring to FIG. 2A, a wafer support structure may be provided. The wafer support structure may include a device substrate 100, a glue layer 400, a release layer 300, and a carrier substrate 200. The release layer 300 may be provided between the carrier substrate 200 and a first surface 100a of the device substrate 100. The release layer 300 may include a first polymerization unit and a second polymerization unit. The first polymerization unit may include a C5 to C100 aromatic compound, and the second polymerization unit may include a siloxane group. The release layer 300 may have a first thickness T1. The first thickness T1 may be the same as that discussed in FIG. 1A.

The glue layer 400 may be provided between the device substrate 100 and the release layer 300. The glue layer 400 may be a temporary adhesion layer. The glue layer 400 may include polysiloxane and its derivative. For example, a coating process may form the glue layer 400 on the first surface 100a of the device substrate 100. The release layer 300 may be coated on a bottom surface of the carrier substrate 200. The carrier substrate 200 and the device substrate 100 may be disposed spaced apart from each other to allow a bottom surface of the release layer 300 to face a top surface of the glue layer 400. Either the carrier substrate 200 or the device substrate 100 may move such that the bottom surface of the release layer 300 may be in contact with the top surface of the glue layer 400. Therefore, the wafer support structure may be formed.

When the glue layer 400 has a thickness T3 of less than about 10 nm, it may be difficult to coat the glue layer 400. When the glue layer 400 has a thickness T3 of greater than about 500 μm, it may be possible to reduce fabrication efficiency of semiconductor devices. According to some embodiments, the thickness T3 of the glue layer 400 may range from about 10 nm to about 500 μm. Therefore, it may be possible to easily perform a coating process of the glue layer 400 and to satisfactorily form the glue layer 400. In addition, it may be possible to increase fabrication efficiency of semiconductor devices.

Figure 2B:
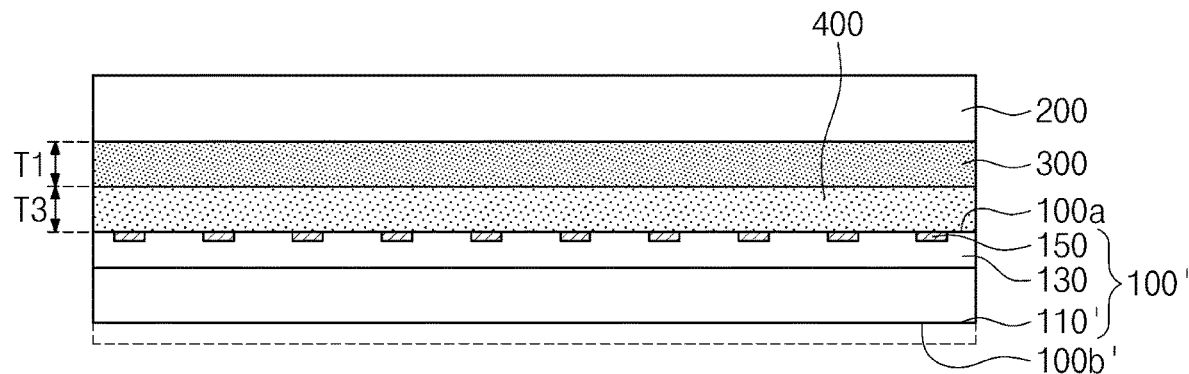

Referring to FIG. 2B, a processing process may be performed on a second surface 100b of the device substrate 100, thereby forming a processed device substrate 100'. As indicated by a dotted line, the processing process may remove a portion of the device substrate 100. The processing process may include, for example, a thinning process of the semiconductor substrate 110, and may be executed as discussed in FIG. 1D. The processed device substrate 100' may include a thinned semiconductor substrate 110', integrated circuits (see 115 of FIG. 1B or 1C), a circuit layer 130, and chip pads 150. The processed device substrate 100' may have a grinded surface on a second surface 100b' thereof.

Figure 2C:
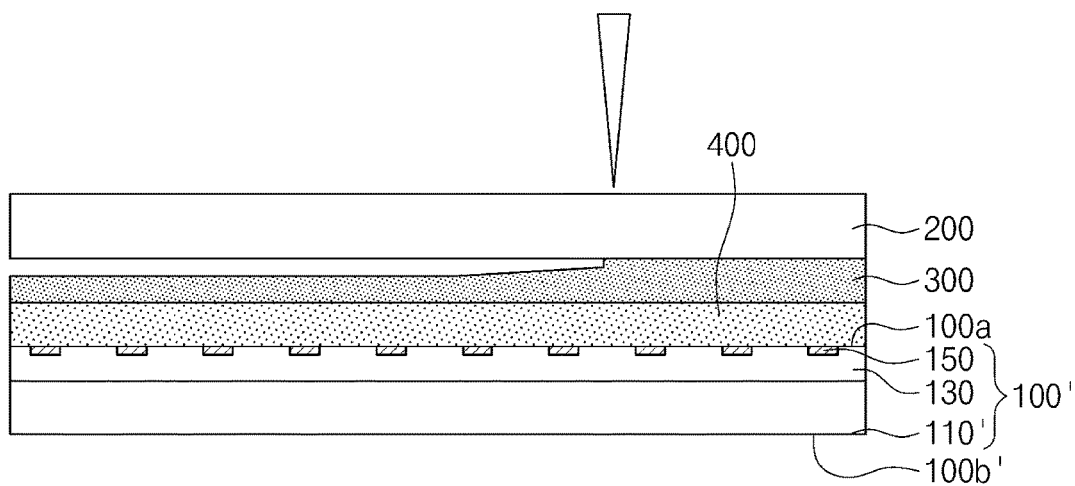

Referring to FIG. 2C, the carrier substrate 200 may be irradiated with light. The irradiation of light may be executed as discussed in FIG. 1E. For example, the light may be an ultraviolet laser. The ultraviolet ray may penetrate the carrier substrate 200 to reach an upper portion of the release layer 300. The ultraviolet ray may decompose the first polymerization unit of the release layer 300. The upper portion of the release layer 300 may be removed by a decomposition reaction. Accordingly, the carrier substrate 200 may be separated from the release layer 300 and the processed device substrate 100'. A remaining portion of the release layer 300 may remain without being removed.

Figure 2D:
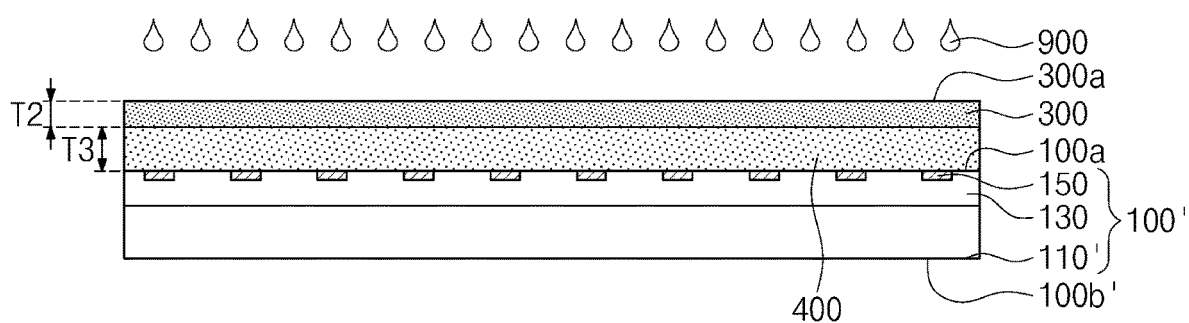

Referring sequentially to FIGS. 2C and 2D, the carrier substrate 200 may be separated to expose one surface 300a of the release layer 300. The one surface 300a of the release layer 300 may be a top surface of the release layer 300 that remains. The remaining release layer 300 may have a second thickness T2. The second thickness T2 may be the same as or less than the first thickness T1 of FIG. 2A.

Figure 2E:
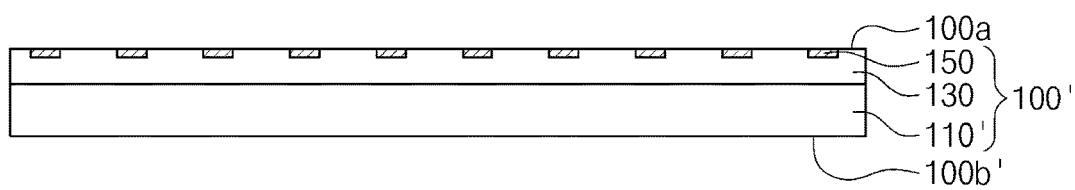

Referring sequentially to FIGS. 2D and 2E, a cleaning process that uses a cleansing agent 900 may be performed on the exposed one surface 300a of the release layer 300. The cleansing agent 900 may react with the siloxane group of the second polymerization unit of the release layer 300, and thus the siloxane group may be decomposed. Therefore, the release layer 300 may be removed to expose the glue layer 400. The cleansing agent 900 may remove the glue layer 400. For example, the cleaning process may include removing the release layer 300 and removing the glue layer 400. The removal of the glue layer 400 and the removal of the release layer 300 may be accomplished in a single cleaning process. The glue layer 400 and the release layer 300 may be removed with the same cleansing agent 900. In an example, at least 99.5% of both the release layer and glue layer, e.g. 99.9% or more, are removed with the cleansing agent. Accordingly, it may be possible to achieve simplification of fabrication process of semiconductor devices and to reduce a time required for fabrication process of semiconductor devices.

When the thickness T3 of the glue layer 400 has a thickness T3 is greater than about 500 μm, it may be difficult to remove the glue layer 400. According to some embodiments, as the thickness T3 of the glue layer 400 is equal to or less than about 500 μm, it may be possible to satisfactorily remove the glue layer 400. The cleaning process may be performed until the first surface 100a of the device substrate 100 is exposed as shown in FIG. 1G.

Although not shown, after the removal of the release layer 300, a dicing process may further be performed on the device substrate 100', such that the device substrate 100' may be separated into a plurality of semiconductor devices. In this case, the semiconductor devices may be semiconductor chips.

The following will discuss fabrication of release layers and property evaluation results.

Experimental Example 1

A polymerization reaction is performed between polydimethylsiloxane and the material represented by Chemical Formula 2A. The material represented by Chemical Formula 2A is commercially available from Tokyo Chemical Industry Co., Ltd. Polydimethylsiloxane, whose number average molecular weight is about 900 g/mol to about 1000 g/mol, is commercially available from Gelest Inc. A film is formed by coating a polymerization reaction product.

Experimental Example 2

A polymerization reaction is performed between polydimethylsiloxane and the material represented by Chemical Formula 2B. The material represented by Chemical Formula 2B is commercially available from Tokyo Chemical Industry Co., Ltd. Polydimethylsiloxane is used which is the same as that of Experimental Example 1. A film is formed by coating a polymerization reaction product.

Experimental Example 3

A polymerization reaction is performed between polydimethylsiloxane and the material represented by Chemical Formula 2C. The material represented by Chemical Formula 2C is commercially available from Tokyo Chemical Industry Co., Ltd. Polydimethylsiloxane is used which is the same as that of Experimental Example 1. A film is formed by coating a polymerization reaction product.

Figure 3:
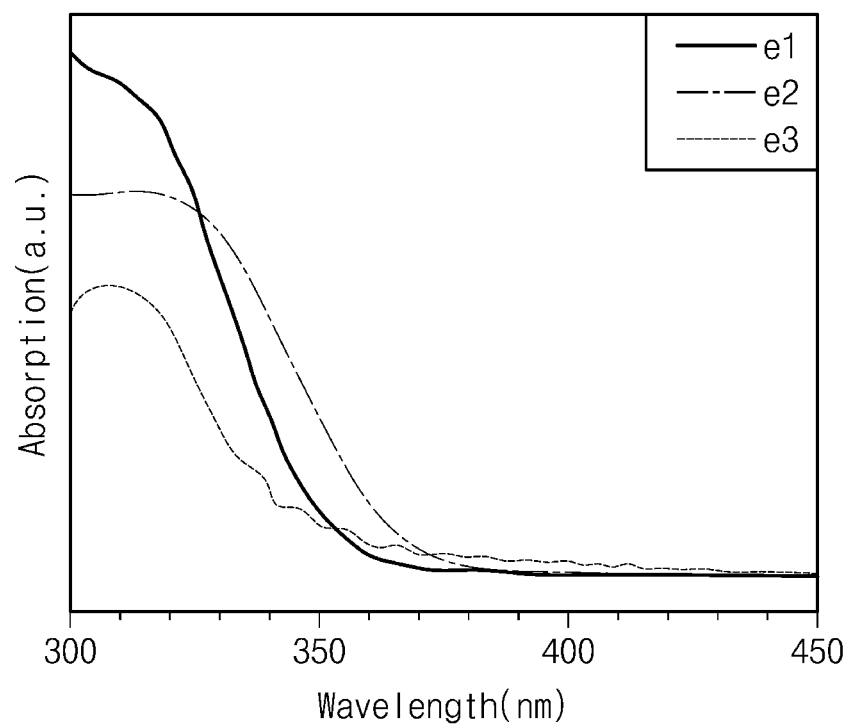
FIG. 3 illustrates a graph showing results of absorption at each wavelength of Experimental Examples 1, 2, and 3.

FIG. 3 illustrates a graph showing results of absorption at each wavelength of Experimental Examples 1, 2, and 3.

Referring to FIG. 3, each of the films of Experimental Examples 1, 2, and 3 (respectively represented by e1, e2, and e3) may absorb light whose wavelength is equal to or less than about 400 nm.

Table 1 lists thicknesses of a release layer in accordance with cleaning time. A material including a siloxane polymerization unit is deposited to form a release layer having a thickness of about 102 μm on a temporary substrate. Tetra-n-butylammonium fluoride is used as a cleansing agent to clean the release layer.

TABLE 1

| Cleaning time (minute) | 0 | 1 | 2 | 4 |
|---|---|---|---|---|
| Thickness of release layer | 102 μm | 71 μm | 41.5 μm | 0 μm (all removed) |

Referring to Table 1, a cleaning process is performed for about 4 minutes, and then the release layer is completely removed. The cleansing agent may promptly remove a release agent.

According to the present inventive concepts, a release layer may include an aromatic polymerization unit and may be decomposed by an ultraviolet ray. The release layer may include a siloxane polymerization unit and may be decomposed by a cleansing agent. According to some embodiments, the separation of a device substrate may include performing an irradiation process of an ultraviolet ray and a cleaning process. Therefore, the device substrate may be simply separated. The release layer may be satisfactorily separated from the device substrate.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A method of fabricating a semiconductor device, the method comprising:
   providing a release layer between a carrier substrate and a first surface of a device substrate to attach the device substrate to the carrier substrate;
   irradiating the carrier substrate with an ultraviolet ray to separate the carrier substrate from the release layer and to expose one surface of the release layer; and
   performing a cleaning process on the one surface of the release layer to expose the first surface of the device substrate,
   wherein the release layer includes an aromatic polymerization unit and a siloxane polymerization unit.

2. The method of claim 1, wherein irradiating the ultraviolet ray includes decomposing the aromatic polymerization unit of the release layer.

3. The method of claim 2, wherein performing the cleaning process includes decomposing the siloxane polymerization unit of the release layer.

4. The method of claim 1, further comprising forming a glue layer between the device substrate and the release layer.

5. The method of claim 4, wherein the cleaning process includes removing the release layer and removing the glue layer.

6. The method of claim 1, wherein the release layer is represented by Chemical Formula 1,

[Chemical Formula 1]

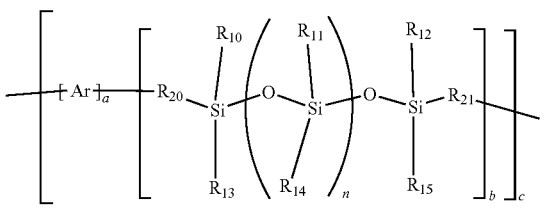

wherein, in Chemical Formula 1,
Ar includes a C5 to C100 substituted or unsubstituted aromatic cyclic compound,
$R_{10}$, $R_{11}$, $R_{12}$, $R_{13}$, $R_{14}$, and $R_{15}$ independently are hydrogen or an alkyl group having 1 to 3 carbon atoms,
$R_{20}$ and $R_{21}$ independently are hydrogen or an alkyl group having 1 to 5 carbon atoms,
a is an integer between 1 and 100,
b is an integer between 1 and 100,
n is an integer between 1 and 1000, and
c is an integer between 10 and 100000.

7. The method of claim 1, wherein the cleaning process is performed by using a cleansing agent,
wherein the cleansing agent includes a material represented by Chemical Formula A,

[Chemical Formula A]

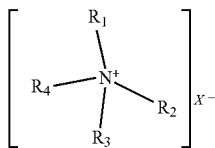

wherein, in Chemical Formula A,
$R_1$, $R_2$, $R_3$, and $R_4$ independently are hydrogen or an alkyl group having 1 to 10 carbon atoms, and
X is fluorine, chlorine, bromine, or iodine.

8. The method of claim 1, further comprising performing a processing process on a second surface of the device substrate to form a processed device substrate,
wherein the second surface of the device substrate is opposite to the first surface of the device substrate.

9. The method of claim 8, wherein
the device substrate includes a semiconductor substrate, a plurality of integrated circuits, a circuit layer, and a plurality of chip pads, and
performing the processing process includes thinning the semiconductor substrate.

10. The method of claim 1, wherein separating the carrier substrate includes removing an upper portion of the release layer,
wherein, after the carrier substrate is separated, a remaining portion of the release layer remains on the device substrate.

11. A method of separating a substrate, the method comprising:
providing a wafer support structure that includes a device substrate, a carrier substrate, and a release layer between the device substrate and the carrier substrate;
irradiating the carrier substrate with an ultraviolet ray to separate the carrier substrate from the release layer; and
using a cleansing agent to remove the release layer and to expose the device substrate,
wherein the release layer includes:
an aromatic polymerization unit that is decomposed by the ultraviolet ray; and
a siloxane polymerization unit that is decomposed by the cleansing agent.

12. The method of claim 11, wherein the wafer support structure further includes a glue layer between the device substrate and the release layer.

13. The method of claim 12, further comprising using the cleansing agent to remove the glue layer,
wherein removing the glue layer and removing the release layer are performed in a single process.

14. The method of claim 12, wherein a thickness of the glue layer is in a range of about 10 nm to about 500 μm.

15. The method of claim 11, wherein a thickness of the release layer is in a range of about 10 nm to about 500 μm.

16. A method of fabricating a semiconductor device, the method comprising:
providing a release layer between a carrier substrate and a first surface of a device substrate to attach the device substrate to the carrier substrate;
performing a processing process on a second surface of the device substrate to form a processed device substrate;
irradiating the carrier substrate with an ultraviolet ray to separate the carrier substrate from the release layer and the processed device substrate and to expose one surface of the release layer; and
allowing the one surface of the release layer to undergo a cleaning process to expose the first surface of the device substrate,
wherein the release layer includes:
a first polymerization unit that is decomposed by irradiation of the ultraviolet ray; and
a second polymerization unit that is decomposed by the cleaning process, the second polymerization unit being different from the first polymerization unit.

17. The method of claim 16, further comprising forming a glue layer between the device substrate and the release layer,
wherein the cleaning process includes removing the release layer and removing the glue layer,
wherein removing the release layer and removing the glue layer are performed in a single process in which the same cleansing agent is used.

18. The method of claim 16, wherein
the first polymerization unit includes an aromatic polymerization unit, and
the second polymerization unit includes a siloxane group.

19. The method of claim 16, wherein the release layer includes a material represented by Chemical Formula 1A,

[Chemical Formula 1A]

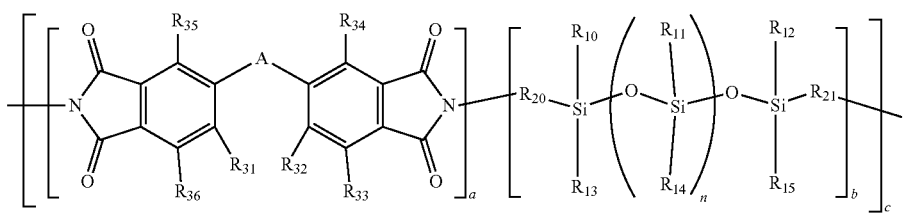

wherein, in Chemical Formula 1A, $R_{10}$, $R_{11}$, $R_{12}$, $R_{13}$, $R_{14}$, and $R_{15}$ independently are hydrogen or an alkyl group having 1 to 3 carbon atoms, $R_{20}$ and $R_{21}$ independently are hydrogen or an alkyl group having 1 to 5 carbon atoms, $R_{31}$, $R_{32}$, $R_{33}$, $R_{34}$, $R_{35}$, and $R_{36}$ independently are hydrogen or an alkyl group having 1 to 3 carbon atoms, A is a single bond, oxygen (O), sulfur (S), a C1 to C10 alkyl group, or a C5 to C50 aromatic cyclic compound, a is an integer between 1 and 100, b is an integer between 1 and 100, n is an integer between 1 and 1000, and c is an integer between 10 and 100000.

20. The method of claim 16, wherein the cleaning process is performed by using a cleansing agent that includes tetra-n-butylammonium fluoride (TBAF).

\* \* \* \* \*